United States Patent
Fujii et al.

(10) Patent No.: US 10,299,369 B2
(45) Date of Patent: May 21, 2019

(54) MOUNTED STRUCTURE OF LAMINATED CAPACITOR, AND METHOD OF MOUNTING LAMINATED CAPACITOR

(71) Applicant: Murata Manufacturing Co., Ltd., Nagaokakyo-shi, Kyoto-fu (JP)

(72) Inventors: Yasuo Fujii, Nagaokakyo (JP); Hiroaki Hori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 91 days.

(21) Appl. No.: 15/586,312

(22) Filed: May 4, 2017

(65) Prior Publication Data

US 2017/0332483 A1 Nov. 16, 2017

(30) Foreign Application Priority Data

May 13, 2016 (JP) ................. 2016-096630

(51) Int. Cl.
*H05K 1/00* (2006.01)
*H05K 1/02* (2006.01)
(Continued)

(52) U.S. Cl.
CPC ............. *H05K 1/0231* (2013.01); *H01G 2/06* (2013.01); *H01G 4/012* (2013.01); *H01G 4/232* (2013.01);
(Continued)

(58) Field of Classification Search
CPC ...... H05K 1/0231; H05K 1/115; H05K 1/181; H05K 3/303; H05K 2201/10015;
(Continued)

(56) References Cited

U.S. PATENT DOCUMENTS 5,488,540 A * 1/1996 Hatta .................. H05K 1/0225
174/260
2002/0017700 A1 2/2002 Mori et al.
(Continued)

FOREIGN PATENT DOCUMENTS

JP 11-015870 A 1/1999
JP 2002-025856 A 1/2002
(Continued)

OTHER PUBLICATIONS

JP 2002025856 A English Translation ; published in 2002 (Year: 2002).*

(Continued)

*Primary Examiner* — Pete T Lee
(74) *Attorney, Agent, or Firm* — Keating & Bennett, LLP

(57) ABSTRACT

A wiring board is provided with power supply patterns for each type of power supply of an IC. An IC has a plurality of power supply terminals for each type of power supply. For each type of power supply, two or more laminated capacitors are provided in parallel between the power supply of IC and a ground. Two or more laminated capacitors provided for each type of power supply include a laminated capacitor having a Q factor of less than about 0.5. For each type of power supply, in order to satisfy a target impedance, two or more laminated capacitors are arranged and distributed such that at least half of the plurality of power supply terminals are included in a region obtained by combining cover areas.

16 Claims, 11 Drawing Sheets

(51) Int. Cl.
*H01G 4/012* (2006.01)
*H01G 4/248* (2006.01)
*H01G 4/30* (2006.01)
*H03H 7/38* (2006.01)
*H05K 1/11* (2006.01)
*H05K 1/18* (2006.01)
*H05K 3/30* (2006.01)
*H01G 4/35* (2006.01)
*H01G 4/40* (2006.01)
*H01G 2/06* (2006.01)
*H01G 4/232* (2006.01)

(52) U.S. Cl.
CPC ............... *H01G 4/248* (2013.01); *H01G 4/30* (2013.01); *H01G 4/35* (2013.01); *H01G 4/40* (2013.01); *H03H 7/38* (2013.01); *H05K 1/115* (2013.01); *H05K 1/181* (2013.01); *H05K 3/303* (2013.01); *H05K 1/0262* (2013.01); *H05K 2201/10015* (2013.01); *H05K 2201/10522* (2013.01); *H05K 2201/10545* (2013.01); *H05K 2201/10734* (2013.01); *Y02P 70/611* (2015.11)

(58) Field of Classification Search
CPC .......... H05K 2201/10522; H05K 2201/10545; H05K 2201/10734; H05K 1/0262; H05K 2201/1073; H01G 4/012; H01G 4/248; H01G 2/06; H01G 4/232; H01G 4/30; H01G 4/35; H01G 4/40; H03H 7/38; Y02P 70/611

See application file for complete search history.

(56) References Cited

U.S. PATENT DOCUMENTS

| 2003/0102523 | A1* | 6/2003 | Li | H01G 4/232 257/535 |
| 2008/0290495 | A1* | 11/2008 | Uematsu | H01L 23/50 257/691 |
| 2009/0059469 | A1 | 3/2009 | Lee et al. | |
| 2015/0041198 | A1* | 2/2015 | Lee | H01G 2/06 174/260 |
| 2017/0330689 | A1* | 11/2017 | Hatanaka | H01G 4/30 |

FOREIGN PATENT DOCUMENTS

| JP | 2007-329282 A | 12/2007 |
| JP | 2009-060114 A | 3/2009 |
| JP | 2012-164817 A | 8/2012 |

OTHER PUBLICATIONS

JP 2012-164817A English Translation ; published in 2012 (Year: 2012).*

Official Communication issued in Japanese Patent Application No. 2016-096630, dated Sep. 4, 2018.

* cited by examiner

MOUNTED STRUCTURE OF LAMINATED CAPACITOR, AND METHOD OF MOUNTING LAMINATED CAPACITOR

CROSS REFERENCE TO RELATED APPLICATIONS

This application claims the benefit of priority to Japanese Patent Application No. 2016-096630 filed on May 13, 2016. The entire contents of this application are hereby incorporated herein by reference.

BACKGROUND OF THE INVENTION

1. Field of the Invention

The present invention relates to a mounted structure of a laminated capacitor, and a method of mounting a laminated capacitor.

2. Description of the Related Art

On a wiring board having an integrated circuit (IC) mounted thereon, a decoupling capacitor is sometimes mounted between a power supply of the integrated circuit and a ground for the purpose of suppressing voltage variation or removing noise during operation of the integrated circuit. In the case where a decoupling capacitor is mounted, it is desirable that power supply impedance be low in order to suppress voltage variation.

In recent years, with a decrease in voltage and an increase in current of a power supply supplied to an integrated circuit, the need for a target impedance required for a power supply impedance has become increasingly strict. Conventionally, in order to keep the power supply impedance within the target impedance, multiple two-terminal capacitors have been mounted to reduce ESL (Equivalent Series Inductance).

In order to mount multiple two-terminal capacitors on a wiring board, however, the wiring board needs to have a large mounting area. As a method of reducing a mounting area, for example, Japanese Patent Laying-Open No. 2007-329282 discloses a multilayer wiring board including a first signal electrode layer, a ground electrode layer, a power supply electrode, and a second signal electrode layer laminated therein, in which an IC is mounted on an upper surface of the board, while a three-terminal capacitor is mounted on a lower surface of the board. Such use of a three-terminal capacitor having lower ESL than that of a two-terminal capacitor enables a reduction in the number of decoupling capacitors.

In a wiring board having a decoupling capacitor mounted thereon, anti-resonance occurs between the capacity of an integrated circuit and the inductance of the capacitor. As a result of this anti-resonance, power supply impedance increases as the frequency increases on the lower frequency side, and decreases as the frequency increases on the higher frequency side, with an anti-resonance frequency being defined as a boundary. That is, the power supply impedance has a characteristic that is peaked near the anti-resonance frequency. Since there is a possibility that the power supply impedance at this anti-resonance frequency may exceed a target impedance, it is desirable to suppress the anti-resonance.

Examples of methods of suppressing the anti-resonance include increasing the ESR (Equivalent Series Resistance) of the decoupling capacitor. For example, Japanese Patent Laying-Open No. 2009-60114 discloses a laminated chip capacitor including a capacitor body including first and second capacitor units arranged in a direction of lamination, and a plurality of external electrodes provided on a side surface of the capacitor body, in which the first and second capacitor units are provided such that the first capacitor unit has a lower ESL than that of the second capacitor unit and the first capacitor unit has a higher ESR than that of the second capacitor unit. Japanese Patent Laying-Open No. 2009-60114 further discloses that the first and second capacitor units are coupled to each other through a coupling conductor line during mounting of the laminated chip capacitor having this configuration on a circuit board, and that the ESR of the second capacitor unit is substantially increased by serial addition of the resistance of this coupling conductor line to the second capacitor unit. This substantially reduces the difference in ESR between the first and second capacitor units, to produce a constant impedance characteristic over a wide frequency band.

Target impedance may be defined in two stages of a first target impedance in a frequency band smaller than or equal to a boundary frequency, and a second target impedance greater than the first target impedance and in a frequency band greater than the boundary frequency. In order to satisfy this target impedance, a power supply impedance that increases at an anti-resonance frequency needs to be smaller than or equal to the second target impedance, and the power supply impedance needs to be smaller than or equal to the first target impedance at a boundary frequency.

The use of a capacitor having a high ESR as in the method disclosed in Japanese Patent Laying-Open No. 2009-60114 can keep the power supply impedance at the anti-resonance frequency at relatively low level, but increases the power supply impedance on the lower frequency side of the anti-resonance frequency. As such, there is a possibility that the power supply impedance that increases on this lower frequency side may exceed the first target impedance at the boundary frequency. In order to reduce the power supply impedance at the boundary frequency, the ESL needs to be reduced.

Accordingly, in order for the power supply impedance at the anti-resonance frequency to be smaller than or equal to the second target impedance and for the power supply impedance at the boundary frequency to be smaller than or equal to the first target impedance, the ESR and the ESL need to be adjusted to appropriate values to increase the ESR and reduce the ESL. In the method disclosed in Japanese Patent Laying-Open No. 2009-60114, however, since a single capacitor is configured to include the first capacitor unit having a high ESR and the second capacitor unit having a low ESL, accurate adjustment of the ESR and the ESL that can be made with the use of a plurality of capacitors may not be possible. Thus, there is a possibility that the target impedance may be exceeded at either the anti-resonance frequency or the boundary frequency. On the other hand, increasing the number of laminated capacitors for accurate adjustment of the ESR and the ESL will increase a mounting area of the laminated capacitors.

SUMMARY OF THE INVENTION

Preferred embodiments of the present invention provide a mounted structure of a laminated capacitor in which a power supply impedance is able to be maintained within a target impedance while a mounting area of laminated capacitors is maintained small, and a method of mounting a laminated capacitor.

A mounted structure of a laminated capacitor according to a preferred embodiment of the present invention includes a wiring board including a power supply pattern and a ground pattern, an integrated circuit mounted on the wiring board, and a laminated capacitor mounted on the wiring board. The wiring board is provided with the power supply pattern for each type of power supply supplied to the integrated circuit. The integrated circuit includes a plurality of power supply terminals for each type of power supply, the plurality of power supply terminals being electrically connected to the power supply pattern of a corresponding one of the power supplies. The laminated capacitor includes a laminated body having a rectangular or substantially rectangular parallelepiped shape in which a first internal electrode and a second internal electrode are alternately laminated with a dielectric layer interposed therebetween, a first external electrode and a second external electrode provided on opposite end surfaces of the laminated body, respectively, and electrically connected to opposite ends of the first internal electrode, respectively, and a pair of third external electrodes provided on opposite side surfaces of the laminated body, respectively, and electrically connected to opposite ends of the second internal electrode, respectively. The first external electrode and the second external electrode are electrically connected to the power supply pattern. The pair of third external electrodes is electrically connected to the ground pattern. For each type of power supply, two or more of the laminated capacitors are provided in parallel between the power supply of the integrated circuit and a ground. The two or more of the laminated capacitors provided for each type of power supply include a laminated capacitor having a Q factor, which indicates a quality factor of a capacitor, of less than about 0.5. For each type of power supply, in order to satisfy a target impedance including a first target impedance in a frequency band smaller than or equal to a boundary frequency, and a second target impedance greater than the first target impedance and in a frequency band greater than the boundary frequency, the two or more of the laminated capacitors are arranged and distributed such that at least half of the plurality of power supply terminals are included in a region obtained by combining cover areas, each of the cover areas being defined to correspond to a maximum allowable wiring length of each of the laminated capacitors.

In a method of mounting a laminated capacitor according to a preferred embodiment of the present invention, an integrated circuit and a laminated capacitor are mounted on a wiring board including a power supply pattern and a ground pattern, the wiring board is provided with the power supply pattern for each type of power supply supplied to the integrated circuit, and the integrated circuit includes a plurality of power supply terminals for each type of power supply, the plurality of power supply terminals being electrically connected to the power supply pattern of a corresponding one of the power supplies. The laminated capacitor includes a laminated body having a rectangular or substantially rectangular parallelepiped shape in which a first internal electrode and a second internal electrode are alternately laminated with a dielectric layer interposed therebetween, a first external electrode and a second external electrode provided on opposite end surfaces of the laminated body, respectively, and electrically connected to opposite ends of the first internal electrode, respectively, and a pair of third external electrodes provided on opposite side surfaces of the laminated body, respectively, and electrically connected to opposite ends of the second internal electrode, respectively. The method includes electrically connecting the first external electrode and the second external electrode to the power supply pattern, and electrically connecting the pair of third external electrodes to the ground pattern, and the each type of power supply, providing two or more of the laminated capacitors in parallel between the power supply of the integrated circuit and a ground. The two or more of the laminated capacitors provided for each type of power supply include a laminated capacitor having a Q factor, which indicates a quality factor of a capacitor, of less than about 0.5. The method further includes, for the each type of power supply, in order to satisfy a target impedance including a first target impedance in a frequency band smaller than or equal to a boundary frequency, and a second target impedance greater than the first target impedance and in a frequency band greater than the boundary frequency, arranging the two or more of the laminated capacitors and distributed such that at least half of the plurality of power supply terminals are included in a region obtained by combining cover areas, each of the cover areas being defined to correspond to a maximum allowable wiring length of each of the laminated capacitors.

In a preferred embodiment of the present invention, for each type of power supply of the integrated circuit in the wiring board, two or more laminated capacitors, for example, three-terminal capacitors, are connected in parallel between the power supply of the integrated circuit and the ground. The two or more laminated capacitors include a laminated capacitor of high ESR having a Q factor, which is a quality factor of a capacitor, of less than about 0.5. Accordingly, the two or more laminated capacitors including a laminated capacitor having a high ESR are provided in parallel, thereby enabling accurate adjustment of the ESR by the two or more laminated capacitors, to increase the ESR appropriately. The increased ESR reduces or prevents anti-resonance that occurs between the capacity of the integrated circuit and the inductance of the laminated capacitors.

Consequently, the power supply impedance is able to be maintained within the second target impedance in the frequency band greater than the boundary frequency, particularly at an anti-resonance frequency.

Further, in a preferred embodiment of the present invention, for each type of power supply of the integrated circuit in the wiring board, two or more laminated capacitors are connected in parallel between the power supply of the integrated circuit and the ground, and are arranged and distributed such that at least half of the plurality of power supply terminals are included in the region obtained by combining the cover areas of the respective laminated capacitors. The laminated capacitors are three-terminal capacitors, and therefore, laminated capacitors having a low ESL. Further, since the two or more laminated capacitors having a low ESL are connected in parallel, and arranged and distributed with respect to the distribution of the plurality of power supply terminals, the ESL is able to be accurately adjusted using a small number of laminated capacitors, to reduce the ESL appropriately. In addition, the increased ESR enables adjustment of the power supply impedance that increases on the lower frequency side than the anti-resonance frequency, thereby reducing the power supply impedance. Consequently, the power supply impedance is able to be maintained within the first target impedance at the boundary frequency.

Accordingly, the power supply impedance is able to be maintained within the target impedance. Further, according to a preferred embodiment of the present invention, the parallel connection and distributed arrangement of the laminated capacitors enables an appropriate increase in ESR and decrease in ESL by a small number of laminated capacitors, thereby enabling the mounting area of the laminated capacitors to be small.

In the mounted structure of a laminated capacitor according to a preferred embodiment of the present invention, for each type of power supply, two or more and five or less of the laminated capacitors are preferably provided in parallel between the power supply of the integrated circuit and the ground. Since the number of laminated capacitors is set to five or less, the mounting area of the laminated capacitors is able to be reduced.

In the mounted structure of a laminated capacitor according to a preferred embodiment of the present invention, in at least one type of power supply, the two or more of the laminated capacitors are preferably arranged and distributed such that all of the plurality of power supply terminals are included in the region obtained by combining the cover areas. Since the two or more laminated capacitors are arranged and distributed as described above, the ESL is able to be efficiently reduced to lower the power supply impedance.

According to various preferred embodiments of the present invention, the power supply impedance is able to be maintained within the target impedance while the mounting area of the laminated capacitors is maintained small.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
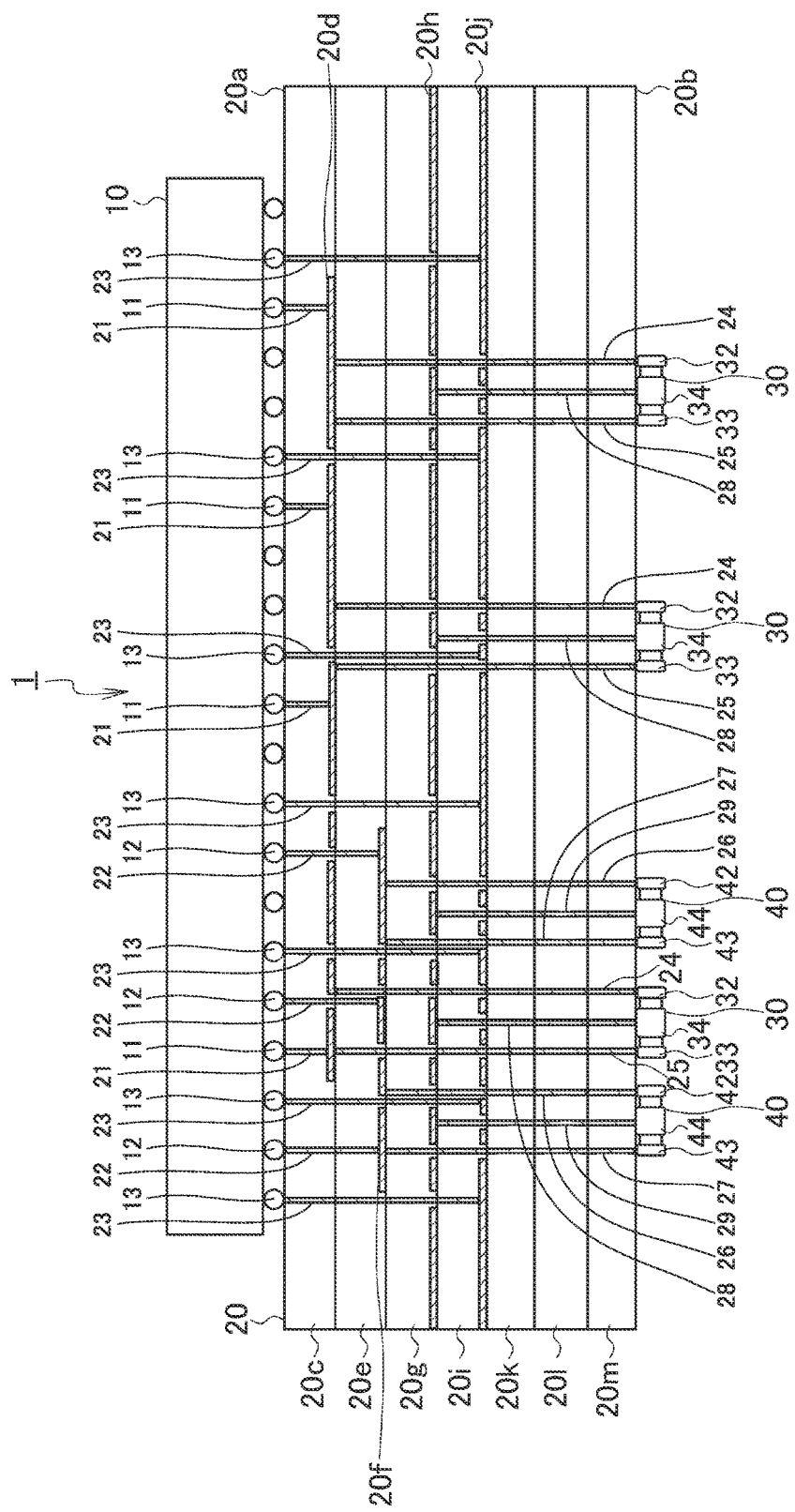
FIG. 1 is a cross-sectional view schematically showing a mounted structure of laminated capacitors according to a preferred embodiment of the present invention.

Preferred embodiments of the present invention will be described below in detail with reference to the drawings. It is noted that the same reference characters will be used for the same or corresponding elements in the drawings. In each drawing, the same elements are designated by the same reference characters and redundant description will not be repeated.

With reference to FIG. 1, a mounted structure 1 of laminated capacitors according to a preferred embodiment of the present invention is described. FIG. 1 is a cross-sectional view showing the configuration of a mounted structure 1 of the laminated capacitors according to a preferred embodiment. It is noted that only vias and patterns are hatched in the cross-sectional view of FIG. 1 for visual clarity.

The mounted structure 1 includes an IC 10, which is an integrated circuit, mounted on a wiring board 20. Electric power is supplied to this IC 10 from each of a plurality of types of power supplies, such as a power supply IC, for example. The present preferred embodiment describes an example of two types of power supplies, which are a power supply for a first APU (Application Processing Unit) and a power supply for a second APU. The type of power supply varies with a supply voltage and other factors. In wiring board 20, for each type of power supply, two or more and five or less laminated capacitors are preferably mounted. For example, laminated capacitors 30 are mounted for the power supply for the first APU, and laminated capacitors 40 are mounted for the power supply for the second APU. The laminated capacitors 30 and the laminated capacitors 40 are decoupling capacitors connected between the power supplies of the IC 10 and a ground.

IC 10 is described below. IC 10 is, for example, an IC of a BGA (Ball Grid Array) package, and is mounted on an upper surface 20a of wiring board 20 by face-down mounting using ball-shaped electrodes which are bumps. The IC 10 includes a plurality of power supply terminals 11 that define and function as power supply pins for the first APU, a plurality of power supply terminals 12 for the second APU, multiple ground terminals 13 that define and function as ground pins, and other suitable terminals.

IC 10 is, for example, an application processing unit (APU) for use in a smartphone, a personal computer, and other suitable devices. As described above, electric power of low voltage and high current, for example, is supplied to the IC 10 from each of a plurality of types of power supplies. In the IC 10, a target impedance, which is a target value for power supply impedance required of a power supply, is set for each type of power supply, so as to ensure stable operation and prevent malfunction. The target impedance includes a first target impedance in a frequency band smaller than or equal to a boundary frequency, and a second target impedance in a frequency band greater than the boundary frequency. The second target impedance is greater than the first target impedance. For example, in the case of an APU, preferably the target impedance for the first APU is about 30 m$\Omega$, in a frequency band smaller than or equal to about 25 MHz, and is about 100 m$\Omega$, in a frequency band greater than about 25 MHz. The target impedance for the second APU is about 25 m$\Omega$, in the frequency band smaller than or equal to about 25 MHz, and is about 80 m$\Omega$, in the frequency band greater than about 25 MHz, for example.

Wiring board 20 is described below. Wiring board 20 is preferably a multilayer wiring board, for example. Wiring board 20 includes IC 10 surface-mounted on its upper surface 20a. Wiring board 20 includes laminated capacitors 30 and laminated capacitors surface-mounted on its lower surface 20b. Wiring board 20 includes, from the top in FIG. 1, insulating layer 20c which is preferably a dielectric layer, for example, for example, power supply pattern 20d, insulating layer 20e, power supply pattern 20f, an insulating layer 20g, ground pattern 20h which is preferably a ground plane, for example, insulating layer 20i, ground pattern 20j, insulating layer 20k, insulating layer 20l, and insulating layer 20m successively laminated therein. A wiring pattern, such as a signal pattern, for example, is provided between the insulating layer 20k and the insulating layer 20l, and between the insulating layer 20l and the insulating layer 20m.

Insulating layers 20c, 20e, 20g, 20i, 20k, 20l, and 20m are preferably made of insulating resin or ceramic, for example, and structured as thin plates having a rectangular or substantially rectangular shape, for example. Power supply patterns 20d and 20f are power supply patterns preferably made of copper foil, for example. Power supply patterns 20d and 20f are each provided for each type of power supply. Power supply pattern 20d is a power supply pattern of the power supply for the first APU. Power supply pattern 20f is a power supply pattern of the power supply for the second APU. Ground patterns 20h and 20j are preferably, for example, solid ground layers each including a ground pattern made of copper foil or other suitable material provided on substantially the entire surface thereof.

Power supply pattern 20d is electrically connected to power supply terminals 11 for the first APU of IC 10, and first external electrodes 32 and second external electrodes 33, which are power supply terminals of laminated capacitors 30 for the first APU. Each power supply terminal 11 is connected to power supply pattern 20d through an interlayer via 21 extending through the insulating layer 20c in the thickness direction. Each first external electrode 32 is connected to power supply pattern 20d through an interlayer via 24 extending in the thickness direction through insulating layers 20m, 20l, 20k, ground pattern 20j, insulating layer 20i, ground pattern 20h, insulating layer 20g, power supply pattern 20f, and insulating layer 20e. Each second external electrode 33 is connected to power supply pattern 20d through an interlayer via 25 extending in the thickness direction through insulating layers 20m, 20l, and 20k, ground pattern 20j, insulating layer 20i, ground pattern 20h, insulating layer 20g, power supply pattern 20f, and insulating layer 20e.

Power supply pattern 20f is electrically connected to power supply terminals 12 for the second APU of IC 10, and first external electrodes 42 and second external electrodes 43 which are power supply terminals of laminated capacitors 40 for the second APU. Each power supply terminal 12 is connected to power supply pattern 20f through an interlayer via 22 extending in the thickness direction through insulating layer 20c, power supply pattern 20d and insulating layer 20e. Each first external electrode 42 is connected to power supply pattern 20f through an interlayer via 26 extending in the thickness direction through insulating layers 20m, 20l, 20k, ground pattern 20j, insulating layer 20i, ground pattern 20h and insulating layer 20g. Each second external electrode 43 is connected to power supply pattern 20f through an interlayer via 27 extending in the thickness direction through insulating layers 20m, 20l, 20k, ground pattern 20j, insulating layer 20i, ground pattern 20h and insulating layer 20g.

Ground pattern 20h is electrically connected to third external electrodes 34 which are ground terminals of laminated capacitors 30 for the first APU, and third external electrodes 44 which are ground terminals of laminated capacitors 40 for the second APU. Each third external electrode 34 is connected to ground pattern 20h through an interlayer via 28 extending in the thickness direction through insulating layers 20m, 20l, 20k, ground pattern 20j and insulating layer 20i. Each third external electrode 44 is connected to ground pattern 20h through an interlayer via 29 extending in the thickness direction through insulating layers 20m, 20l, 20k, ground pattern 20j and insulating layer 20i.

Ground pattern 20j electrically connected to ground terminals 13 of IC 10. Each ground terminal 13 is connected to ground pattern 20j through an interlayer via 23 extending in the thickness direction through insulating layer 20c, power supply pattern 20d, insulating layer 20e, power supply pattern 20f, insulating layer 20g, ground pattern 20h and insulating layer 20i.

Figure 2A:
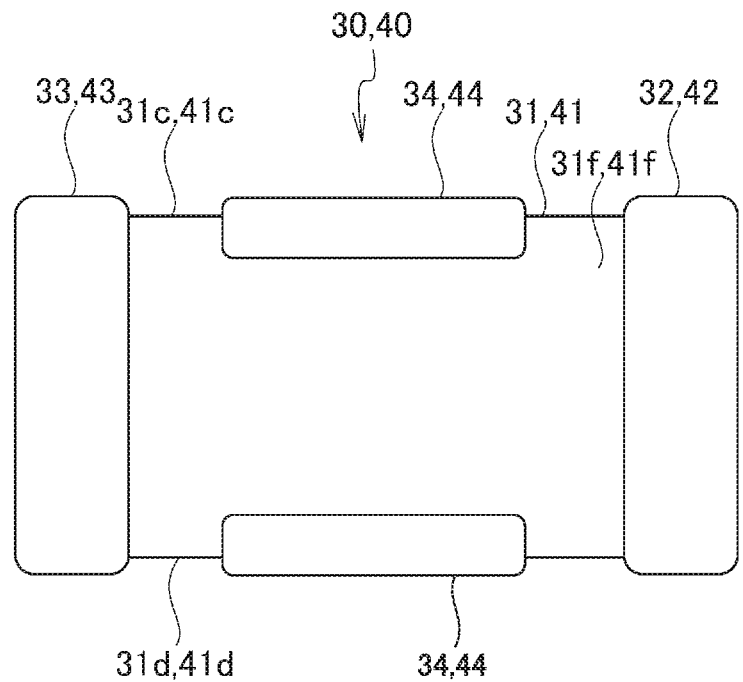
FIG. 2A is a plan view showing an outer shape of the laminated capacitor according to a preferred embodiment of the present invention.
Figure 2B:
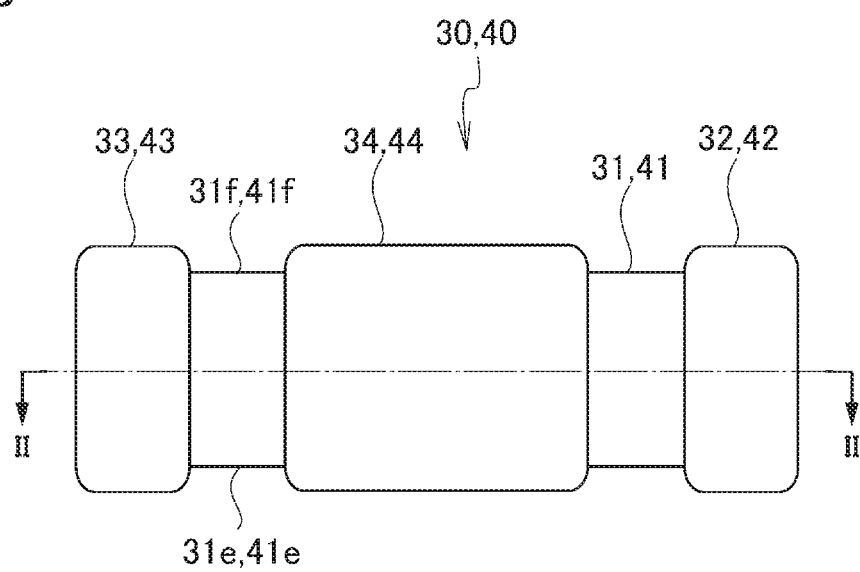
FIG. 2B is a side view showing the outer shape of the laminated capacitor according to a preferred embodiment of the present invention.
Figure 3:
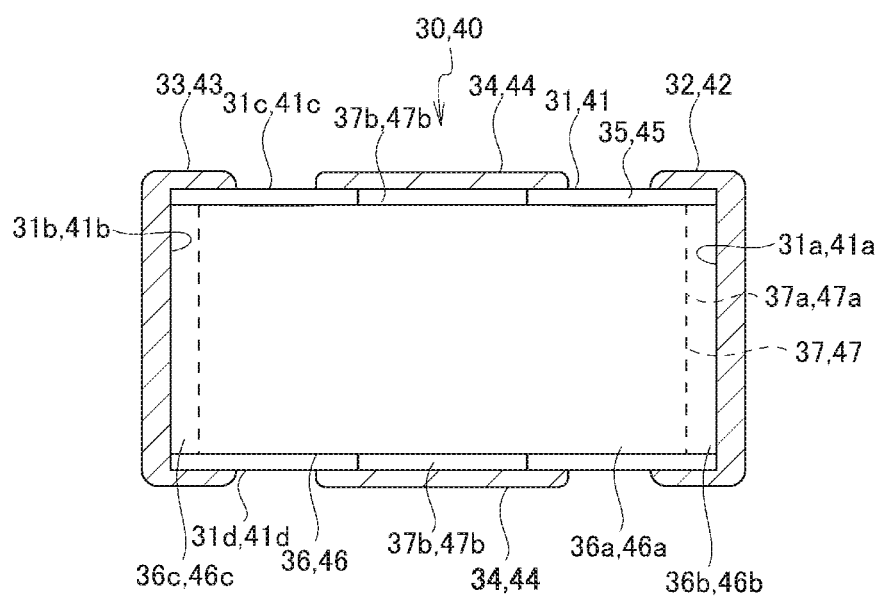
FIG. 3 is a cross-sectional view taken along line II-II in FIG. 2B.

With reference to FIGS. 2A, 2B, and 3, laminated capacitors 30 and 40 are described below. FIG. 2A is a plan view showing an outer shape of laminated capacitors 30 and 40 according to a preferred embodiment of the present invention. FIG. 2B is a side view showing the outer shape of laminated capacitors 30 and according to the preferred embodiment. FIG. 3 is a cross-sectional view taken along line II-II in FIG. 2B.

Laminated capacitors 30 and 40 are decoupling capacitors, as described above. Laminated capacitors 30 and 40 reduce or prevent voltage variation of the power supplies and remove noise during operation of IC 10. For example, laminated capacitors 30 and 40 remove noise produced between the power supplies of IC 10 and the ground, and noise generated by the operation of IC 10. In addition, the power supply impedance is maintained within the target impedance by parallel connection and distributed arrangement of two or more and five or less laminated capacitors 30 and 40, for example.

Laminated capacitors 30 and 40 are chip-type laminated ceramic capacitors having a rectangular or substantially rectangular parallelepiped shape. Laminated capacitors 30 and 40 preferably have outer dimensions including, for example, a dimension of about 1.2 mm in the length direction, a dimension of about 0.9 mm in the width direction, and a dimension of about 0.75 mm in the thickness direction. Laminated capacitors 30 and 40 are preferably high-capacity capacitors, for example, laminated capacitors of about 22 µF. Laminated capacitors 30 and 40 are preferably three-terminal capacitors, for example. A three-terminal capacitor has a lower ESL than that of a two-terminal capacitor. Laminated capacitor 30 includes a laminated body 31, first external electrode 32, second external electrode 33, and the pair of third external electrodes 34. Laminated capacitor 40 includes a laminated body 41, first external electrode 42, second external electrode 43, and the pair of third external electrodes 44. Since laminated capacitors 30 and 40 have the same or substantially the same configuration, description of a detailed configuration of laminated capacitor 30 will be provided below, and description of a detailed configuration of laminated capacitor 40 will not be repeated.

Laminated capacitor 30 is a three-terminal capacitor including laminated body 31, first external electrode 32 and second external electrode 33 that define power supply terminals, and the pair of third external electrodes 34 that define ground terminals. First external electrode 32 is provided on an end surface 31a, which is one of a pair of opposite end surfaces 31a and 31b of laminated body 31. Second external electrode 33 is provided on the other end surface 31b. First external electrode 32 and second external electrode 33 are provided not only on end surfaces 31a and 31b of laminated body 31, but also on a portion of side surfaces 31c and 31d and a portion of main surfaces 31e and 31f of laminated body 31. The pair of third external electrodes 34 is provided on the pair of opposite side surfaces 31c and 31d of laminated body 31, respectively, which are surfaces arranged between the pair of end surfaces 31a and 31b. Third external electrodes 34 are provided not only on side surfaces 31c and 31d of laminated body 31, but also on a portion of main surfaces 31e and 31f of laminated body 31. Third external electrode 34 preferably has a width of about 0.5 mm, for example, in the length direction. A gap between first external electrode 32 or second external electrode 33 and third external electrode 34 is preferably about 0.2 mm, for example.

Laminated body 31 includes a plurality of dielectric layers 35, and a plurality of first internal electrodes 36 and second internal electrodes 37. First internal electrodes 36 and second internal electrodes 37 are alternately laminated with dielectric layers 35 interposed therebetween. Laminated body 31 has a rectangular or substantially rectangular parallelepiped shape, for example, and includes the pair of opposite end surfaces 31a and 31b and the pair of opposite side surfaces 31c and 31d between the pair of opposite main surfaces 31e and 31f.

Dielectric layer 35 is a rectangular or substantially rectangular film. Dielectric layer 35 is preferably made of a dielectric ceramic containing $BaTiO_3$, $CaTiO_3$, $SrTiO_3$, or $CaZrO_3$, for example, as a main component. It is noted that an accessory component such as a Mn compound, a Fe compound, a Cr compound, a Co compound, or a Ni compound may be added to the main component.

First and second internal electrodes 36 and 37 are thin films. First and second internal electrodes 36 and 37 are preferably made of Ni, Cu, Ag, Pd, an Ag—Pd alloy, or Au, for example. First internal electrode 36 and second internal electrode are alternately laminated so as to face each other with dielectric layer 35 interposed therebetween.

First internal electrode 36 includes a body portion 36a, a first drawn-out portion 36b, and a second drawn-out portion 36c. Body portion 36a has a rectangular or substantially rectangular shape, for example. First drawn-out portion 36b is provided on one end of body portion 36a, which is the end on the side of end surface 31a on which first external electrode 32 is provided, and is electrically connected to first external electrode 32. Second drawn-out portion 36c is provided on the other end of body portion 36a, which is the end on the side of end surface 31b on which second external electrode 33 is provided, and is electrically connected to second external electrode 33.

Second internal electrode 37 includes a body portion 37a and a pair of drawn-out portions 37b and 37b. Body portion 37a faces body portion 36a of internal electrode 36 with dielectric layer 35 interposed therebetween, and has a rectangular or substantially rectangular shape similar to body portion 36a, for example. Drawn-out portions 37b and 37b are provided on the opposite ends of body portion 37a, respectively, which are the ends on the sides of side surfaces 31c and 31d on which the pair of third external electrodes 34 and 34 is provided. Drawn-out portions 37b are electrically connected to third external electrodes 34.

First external electrode 32 is electrically connected to first drawn-out portions 36b of the plurality of first internal electrodes 36. First external electrode 32 is electrically connected to power supply pattern 20d through interlayer via 24. Thus, first external electrode 32 is a power supply terminal.

Second external electrode 33 is electrically connected to second drawn-out portions 36c of the plurality of first internal electrodes 36. Second external electrode 33 is electrically connected to power supply pattern 20d through interlayer via 25. Thus, second external electrode 33 is a power supply terminal.

Each of third external electrodes 34 and 34 is electrically connected to a corresponding one of drawn-out portions 37b and 37b of the plurality of second internal electrodes 37. Each of third external electrodes 34 and 34 is electrically connected to ground pattern 20h through interlayer via 28. Thus, third external electrodes 34 and 34 are ground terminals.

First to third external electrodes 32, 33, and 34 each preferably include, for example, a Cu electrode, and a plated layer covering the Cu electrode. For example, first to third external electrodes 32, 33, and 34 each include a nickel-plated layer, and a tin plated layer covering this nickel-plated layer. In particular, one or more laminated capacitors 30 out of two or more laminated capacitors 30 each preferably include a resistive layer on the inside of first external electrode 32 and second external electrode 33 so as to increase a resistance value (ESR). All of laminated capacitors 30 may include a resistive layer. The resistive layer is arranged, for example, on the inside of the Cu electrode, that is, arranged along end surfaces 31a and 31b of laminated body 31, and is covered with the Cu electrode.

The resistive layer is formed, for example, by baking a resistive paste containing a resistive component. As this resistive component, for example, a complex oxide, such as an In—Sn complex oxide (ITO), a La—Cu complex oxide, a Sr—Fe complex oxide, or a Ca—Sr—Ru complex oxide, ruthenium, carbon, or other suitable material may preferably be used. A glass, such as a B—Si-based glass or a B—Si—Zn-based glass, may be added to the resistive layer. The resistive layer may be configured such that its resistivity and other properties are able to be adjusted by the addition of a metal, such as Ni, Cu, Mo, Cr, or Nb, or a metal oxide such as $Al_2O_3$, $TiO_2$, $ZrO_2$, or $ZnO_2$, for example.

Laminated capacitor 30 including the resistive layer described above is a capacitor having a higher ESR than that of a laminated capacitor without the resistive layer. A value of the high ESR is several tens of mΩ, for example. This value of the high ESR is able to be adjusted by the resistive layer. It is noted that two or more laminated capacitors 30 may include a capacitor having a low ESR without the resistive layer.

Figure 4:
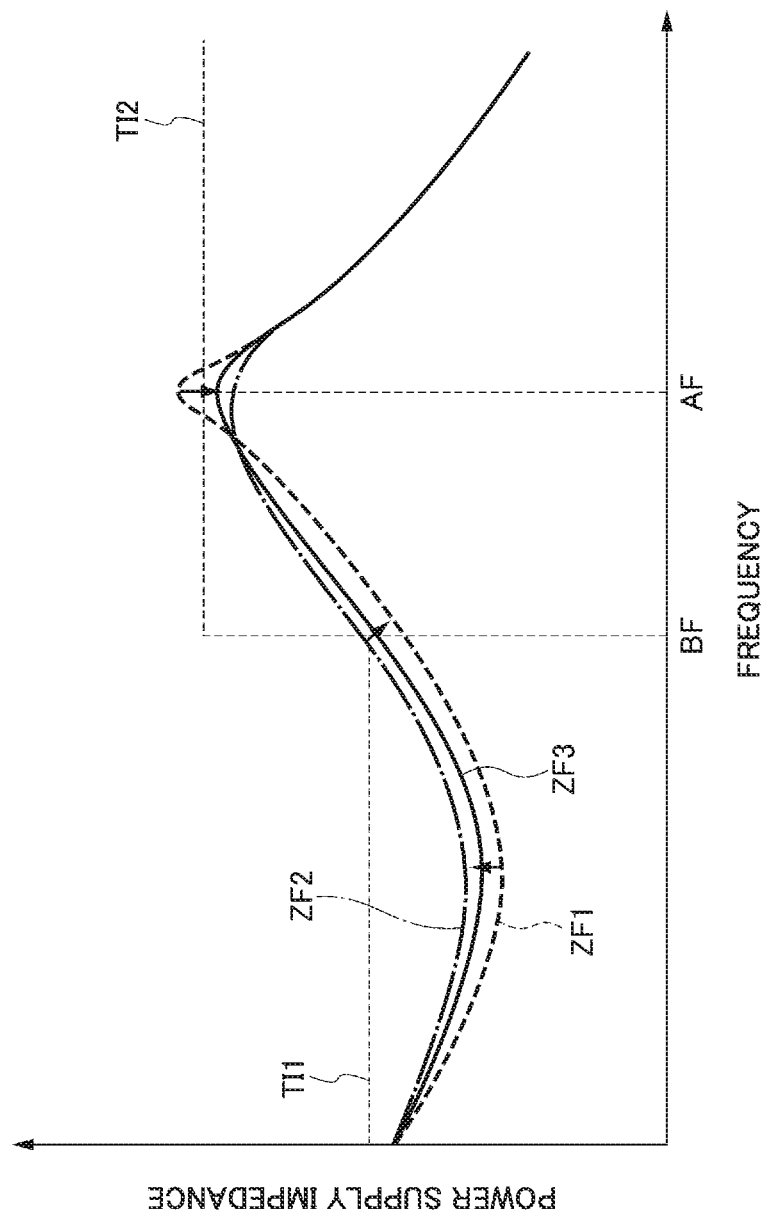
FIG. 4 is a diagram of a method of maintaining the power supply impedance within a target impedance by the mounted structure of the laminated capacitors according to a preferred embodiment of the present invention.

Mounted structure 1 is configured such that, for each type of power supply of IC 10, the power supply impedance satisfies the target impedance by a small number preferably of, for example, two or more and five or less, laminated capacitors 30 and 40, while the mounting area of laminated capacitors 30 and 40, for example, the number of laminated capacitors 30 and 40, is preferably maintained small. A method of maintaining the power supply impedance within the target impedance with the small number of laminated capacitors 30 and 40 is described with reference to FIG. 4. FIG. 4 is a diagram of a method of maintaining the power supply impedance within the target impedance by mounted structure 1 of the laminated capacitors according to a preferred embodiment of the preset invention. In FIG. 4, the horizontal axis represents frequency, and the vertical axis represents power supply impedance.

In IC 10, for each type of power supply, a required capacity of the decoupling capacitors is set. If the capacity of the laminated capacitors is small, the number of laminated capacitors required to satisfy this required capacity of the decoupling capacitors is increased. Thus, high-capacity laminated capacitors 30 and 40 are used in mounted structure 1. The number of laminated capacitors 30 and 40 is able to thereby be reduced.

As described above, the target impedance includes, for each type of power supply of IC 10, a first target impedance TI1 in a frequency band smaller than or equal to a boundary frequency BF, and a second target impedance TI2 in a frequency band greater than boundary frequency BF. In order to ensure stable operation of IC 10, it is required, for each type of power supply, that the power supply impedance satisfy these two stages of first target impedance TI1 and second target impedance TI2.

Since IC 10 has a capacity, anti-resonance occurs between this capacity of IC 10 and the inductance of laminated capacitors 30 and 40. As a result of this anti-resonance, the power supply impedance increases at an anti-resonance frequency AF higher than a boundary frequency BF. Thus, there is a possibility that the power supply impedance at anti-resonance frequency AF higher than boundary frequency BF may exceed second target impedance TI2. In the example shown in FIG. 4, the power supply impedance indicated by a broken line ZF1 exceeds second target impedance TI2 at anti-resonance frequency AF. In order for the power supply impedance to satisfy the target impedance, the power supply impedance at this anti-resonance frequency AF needs to be smaller than or equal to second target impedance TI2.

Therefore, in mounted structure 1, for each type of power supply, two or more laminated capacitors 30 and 40 are connected in parallel between the power supply of IC 10 and the ground, and one or more laminated capacitors 30 and 40 out of these two or more laminated capacitors 30 and 40 has a high ESR. These laminated capacitors 30 and 40 having a high ESR are used to adjust the entire ESR of two or more laminated capacitors 30 and 40 connected in parallel to increase the ESR, thereby raising the level of the power supply impedance on the lower frequency side than the anti-resonance frequency. At the same time, the power supply impedance at the anti-resonance frequency AF is reduced such that it is smaller than or equal to second target impedance TI2.

Figure 5:
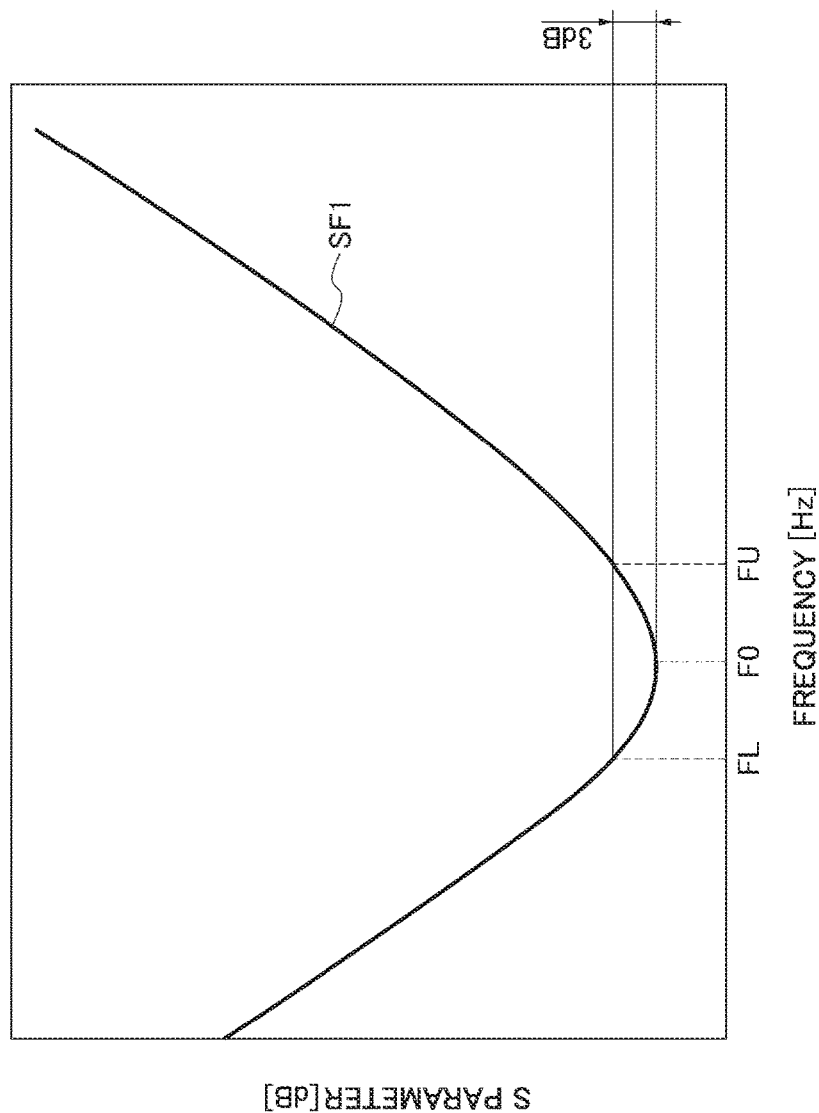
FIG. 5 is a diagram of a method of deriving a Q factor using a full width at half maximum.

The ESR of the laminated capacitors 30 and 40 having a high ESR is defined by a Q factor which is a quality factor of a capacitor. A method of deriving this Q factor is described with reference to FIG. 5. FIG. 5 is a diagram of a method of deriving a Q factor using a full width at half maximum. In FIG. 5, the horizontal axis represents frequency (Hz), and the vertical axis represents S parameter (dB). FIG. 5 shows an example of a frequency characteristic SF1 of an S parameter of a laminated capacitor.

A frequency indicated by a sign F0 in FIG. 5 is a frequency at a resonance point of the laminated capacitor. A frequency indicated by a sign FU is a higher-side frequency of an S parameter higher by about 3 dB than an S parameter at frequency F0 of the resonance point. That is, the frequency indicated by sign FU is a higher-side frequency of a frequency at which the impedance is about $\sqrt{}$ times the impedance at frequency F0 of the resonance point. A frequency indicated by a sign FL is a lower-side frequency of the S parameter higher by about 3 dB than the S parameter at frequency F0 of the resonance point. That is, the frequency indicated by sign FL is a lower-side frequency of the frequency at which the impedance is about $\sqrt{}$ two times the impedance at frequency F0 of the resonance point. The Q factor is calculated from the following Equation 1 using these frequencies F0, FU and FL.

$$Q = \frac{F0}{FU - FL} \qquad \text{(Equation 1)}$$

If the ESR of the laminated capacitor is increased, the width of a 3 dB's worth of frequency with the resonance point as the center increases, that is, the valley of the resonance point becomes more obtuse, resulting in a lower Q factor determined from Equation 1. In the present preferred embodiment, laminated capacitors 30 and 40 having a Q factor of less than about 0.5 are defined as laminated capacitors having a high ESR.

Returning back to FIG. 4, as described above, the increased ESR of laminated capacitors 30 and 40 raises the level of the power supply impedance on the lower frequency side than anti-resonance frequency AF. If the power supply impedance on the lower frequency side becomes too high due to the rise of the level, there is a possibility that the power supply impedance at boundary frequency BF may exceed first target impedance TI1. In the example shown in FIG. 4, a power supply impedance indicated by a chain-dotted line ZF2 falls below second target impedance 112 at anti-resonance frequency AF, but exceeds first target impedance TI1 at boundary frequency BF. In order for the power supply impedance to satisfy the conditions of the target impedance, the power supply impedance at this boundary frequency BF needs to be smaller than or equal to first target impedance TI1.

Therefore, in mounted structure 1, for each type of power supply, two or more laminated capacitors 30 and 40 which are three-terminal capacitors are connected in parallel between the power supply of IC 10 and the ground, and are arranged and distributed such that half or more of the plurality of power supply terminals 11 and 12 of IC 10 are included in a region obtained by combining respective cover areas of these two or more laminated capacitors 30 and 40. These laminated capacitors 30 and 40 which are three-terminal capacitors having a low ESL are connected in parallel, and arranged and distributed with respect to the distribution of power supply terminals 11 and 12, thereby enabling accurate adjustment of the ESR by two or more and five or less laminated capacitors 30 and 40, to reduce the ESL. Consequently, the power supply impedance on the lower frequency side than anti-resonance frequency AF is reduced, and in particular, the power supply impedance at boundary frequency BF is able to be adjusted to be smaller than or equal to first target impedance TI1. In the example shown in FIG. 4, a power supply impedance indicated by a solid line ZF3 falls below second target impedance 112 at anti-resonance frequency AF, and falls below first target impedance TI1 at boundary frequency BF.

It is noted that the frequency of the resonance point and the impedance vary with the capacity of laminated capacitors 30 and 40. Increasing the capacity shifts the frequency of the resonance point to the lower frequency side, and reduces the impedance. By using laminated capacitors 30 and 40 having high capacity, therefore, the power supply impedance is more likely to be smaller than or equal to first target impedance TI1 at boundary frequency BF. In addition, the shape of the valley of the resonance point changes with the ESR of laminated capacitors 30 and 40. Increasing the ESR causes the valley of the resonance point to become more obtuse, that is, results in a lower Q factor.

A cover area of a capacitor is described. A cover area is an area where impedance and inductance are able to be reduced by a single capacitor, and has a maximum allowable wiring length as its radius. The maximum allowable wiring length is a maximum wiring length allowed for a capacitor such that power supply impedance at a target frequency, for example, boundary frequency BF or anti-resonance frequency AF, is designed to be smaller than or equal to target impedance.

This maximum allowable wiring length of a capacitor is described in terms of a relationship with loop impedance. Loop impedance is impedance produced by a loop of a current that passes through a capacitor from a power supply terminal of an IC, and returns to a ground terminal of the IC. This loop impedance is a total value of impedances of a via, a wire, and the capacitor, specifically, impedances of respective inductance components. In the case where a three-terminal capacitor having a low ESL is used as in mounted structure 1, the impedance and inductance of the capacitor are reduced. With this reduction in ESL of the capacitor, the wire is able to be designed to be longer by the difference in impedance of the capacitor in the loop impedance, that is, such that the impedance of the wire is increased. As the maximum allowable wiring length, which is the length of this wire, is increased, the area that is able to be covered by a single capacitor is increased, and the number of power supply terminals of an IC that are able to be covered is increased. Consequently, the number of decoupling capacitors is able to be reduced. In particular, as the ESL of the capacitor is reduced, the maximum allowable wiring length is able to be increased, which in turn is able to increase the cover area and reduce the number of decoupling capacitors.

Figure 6:
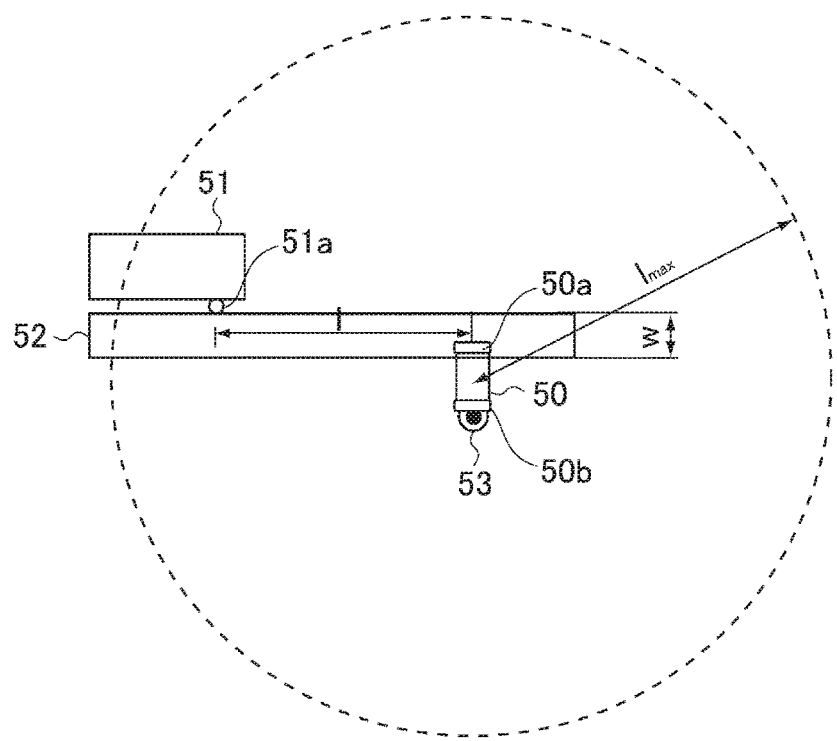
FIG. 6 is a diagram of a method of deriving a maximum allowable wiring length and a cover area.

A maximum allowable wiring length varies with the type of capacitor, via, and wire that is used. A maximum allowable wiring length also varies with the target frequency, the target impedance and other factors. An example of a method of deriving the maximum allowable wiring length and the cover area is described with reference to FIG. 6. FIG. 6 is a diagram of a method of deriving a maximum allowable wiring length and a cover area. FIG. 6 shows an example of wiring of a laminated capacitor 50 which is a decoupling capacitor and an IC 51. In this example, laminated capacitor 50 includes one external electrode 50a connected to a power supply pattern 52, and the other external electrode 50b connected to a via 53. This via 53 is connected to a ground plane (not shown). IC 51 has a power supply terminal 51a connected to power supply pattern 52. Although not shown, IC 51 has a ground terminal connected to a solid ground layer which is a ground plane through a via.

A maximum allowable wiring length $l_{max}$ and a cover area of a capacitor are able to be approximately calculated from the following Equation 2. In Equation 2, $f_T$ represents target frequency, $Z_T$ represents target impedance at target frequency $f_T$, $Z_C$ represents impedance of the capacitor at target frequency $f_T$, h represents a distance from a mounting surface of a layer on which the capacitor is mounted to the solid ground layer, w represents the width of a wiring pattern, and $\mu_0$ represents magnetic permeability.

$$l_{max} = \frac{Z_T - Z_C}{2f_T\mu_0\left(\frac{h}{w}\right)^{0.6}} \quad \text{(Equation 2)}$$

It is noted that impedance $Z_C$ of the capacitor is $2\pi f_T \times L$ at a high frequency exceeding a self-resonance frequency of the capacitor where the wiring pattern length is sufficiently shorter than a wavelength. This L represents residual inductance (ESL) of the capacitor, which is from about 200 pH to about 400 pH for a two-terminal laminated capacitor, from about 50 pH to about 100 pH for a laminated capacitor having a dimension in the length direction smaller than a dimension in the width direction, and from about 10 pH to 50 pH for a three-terminal laminated capacitor.

Figure 7:
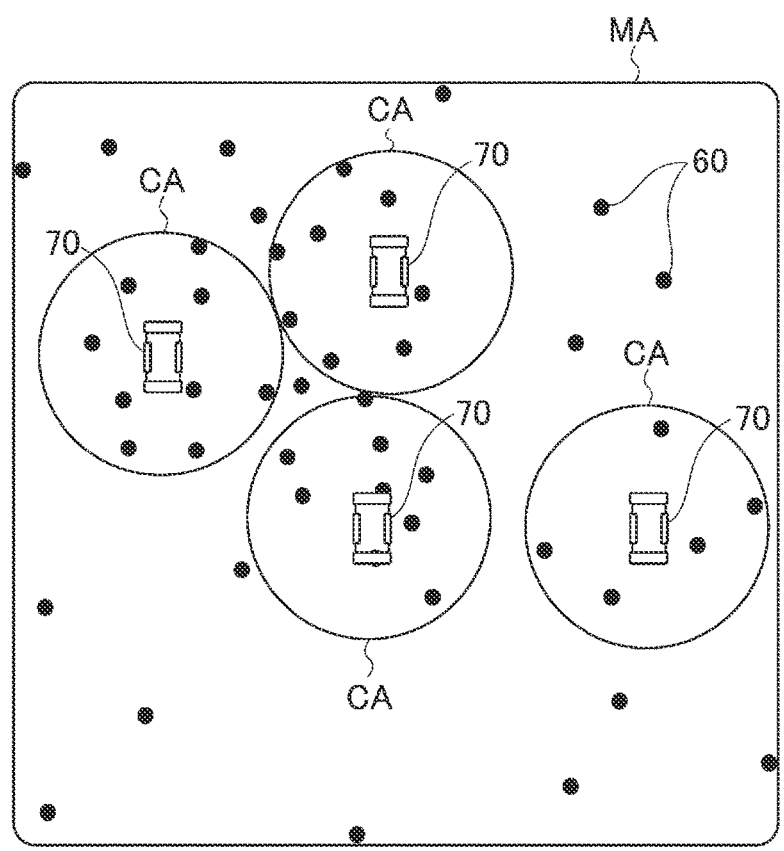
FIG. 7 is a diagram of a method of arranging and distributing two or more laminated capacitors.

A method of arranging and distributing laminated capacitors in consideration of distribution of power supply terminals of an IC and cover areas is described with reference to FIG. 7. FIG. 7 is a diagram of a method of arranging and distributing two or more laminated capacitors. In the example of FIG. 7, a solid circle represents a power supply terminal 60 of an IC, a substantial rectangle indicated by a sign MA represents a distribution area where all power supply terminals 60 are arranged, and a circle indicated by a sign CA represents a cover area of a laminated capacitor 70. In this example, there are four laminated capacitors 70 connected in parallel. It is noted that power supply terminals 60 of the IC mounted on the upper surface of a wiring board and laminated capacitors 70 mounted on the lower surface of the wiring board are shown on the same plane in FIG. 7 for visual clarity of a relationship between the arrangement of power supply terminals 60 and cover areas CA of laminated capacitors 70.

When seen in a direction perpendicular to the upper surface of the wiring board, as the position of power supply terminal 60 becomes closer to the position of laminated capacitor 70, the distance from laminated capacitor 70 to power supply terminal 60 is reduced. This reduces the wiring length between power supply terminal 60 and laminated capacitor 70, thus reducing the inductance and the impedance of the wire. In particular, the inductance is reduced when power supply terminal 60 is included in cover area CA of laminated capacitor 70. Accordingly, the higher the number of power supply terminals 60 included in cover area CA of any of laminated capacitors 70, the lower the inductance that is able be achieved.

Thus, four laminated capacitors 70 are arranged and distributed with respect to the distribution of power supply terminals 60, such that as many power supply terminals 60 as possible are included in a region obtained by combining cover areas CA of four laminated capacitors 70. The ESL is able to be reduced when half or more of all power supply terminals 60 are included in the region obtained by combining cover areas CA. In particular, it is preferable that all power supply terminals 60 be included in the region obtained by combining cover areas CA. Such distributed arrangement of laminated capacitors 70 connected in parallel enables accurate adjustment of the ESL by a small number of laminated capacitors 70, to reduce the ESL appropriately.

It is noted that, in the case where laminated capacitors 70 are arranged and distributed as shown in FIG. 7, many power supply terminals 60 are included in cover areas CA by arranging laminated capacitors 70 at a portion where power supply terminals are densely arranged, which is an upper left portion in distribution area MA in the example shown in FIG. 7. In addition, a portion that is wasted in cover areas CA is able to be reduced by arranging laminated capacitors 70 such that cover areas CA of adjacent or neighboring laminated capacitors 70 do not overlap each other to the extent possible. In the case where distribution area MA of power supply terminals 60 is greater than a region obtained by combining all cover areas CA, a portion that is wasted in cover areas CA is able to be reduced by arranging laminated capacitors 70 such that cover areas CA of laminated capacitors 70 do not protrude from distribution area MA.

Figure 8:
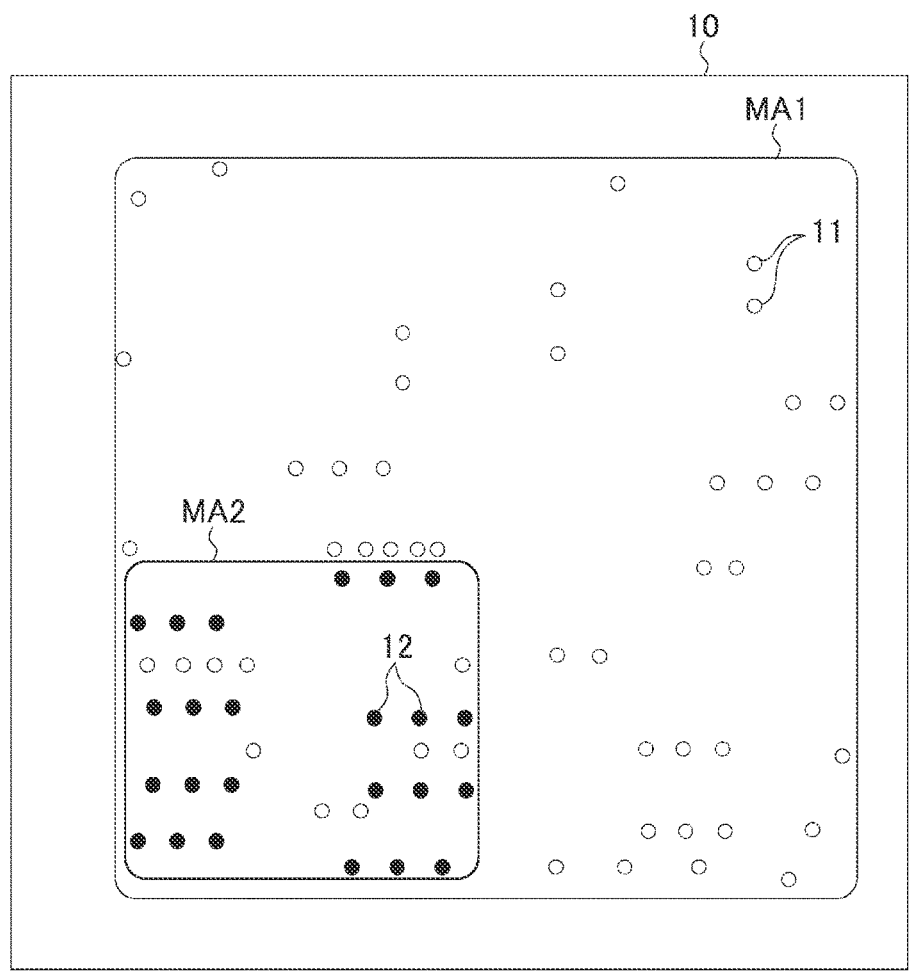
FIG. 8 is a diagram showing an example of a distribution of power supply terminals of two types of power supplies in an IC.
Figure 9:
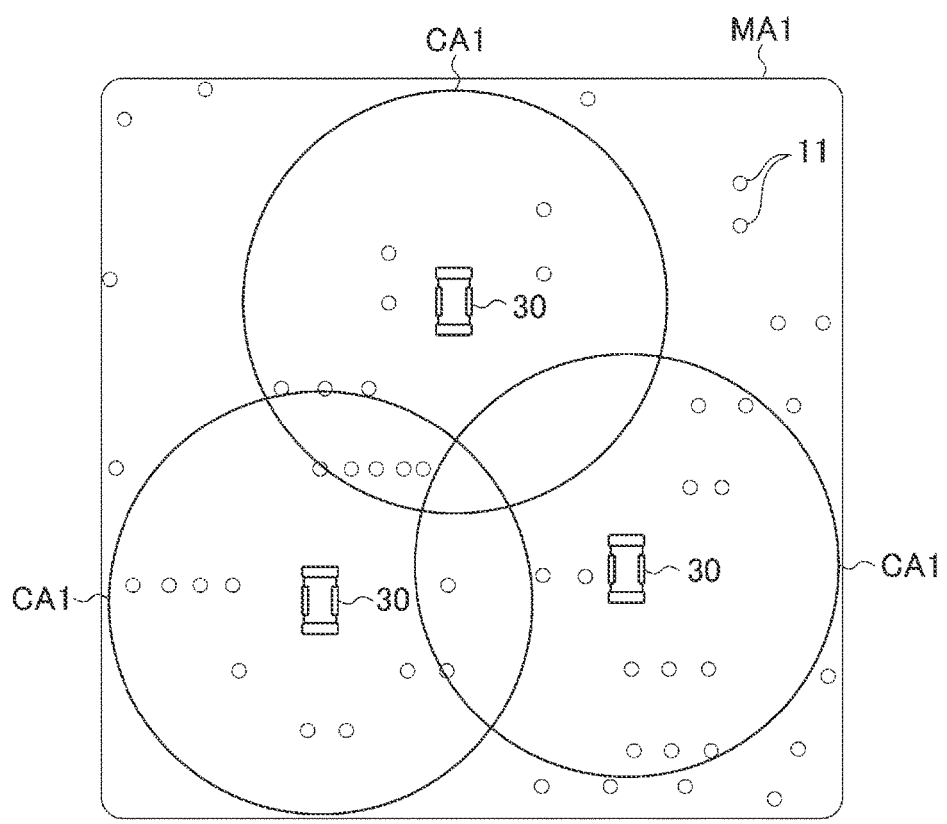
FIG. 9 is a diagram showing an example of a distributed arrangement of laminated capacitors with respect to the distribution of power supply terminals for a first APU in FIG. 8.
Figure 10:
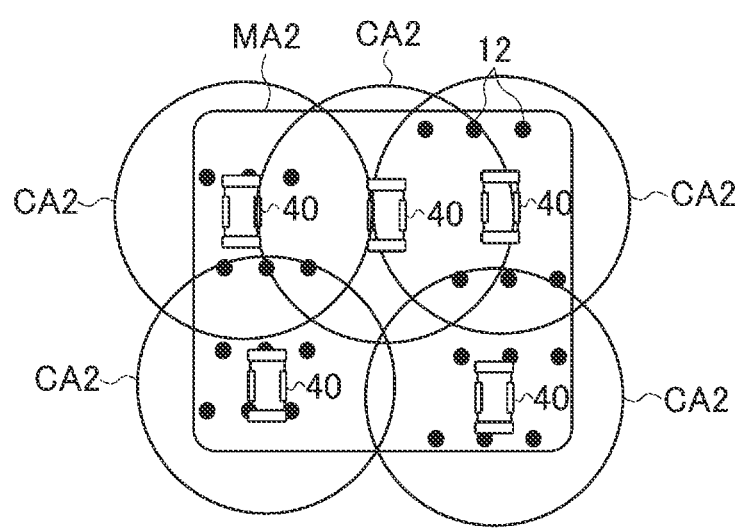
FIG. 10 is a diagram showing an example of a distributed arrangement of laminated capacitors with respect to the distribution of power supply terminals for a second APU in FIG. 8.

With reference to FIGS. 8 to 10, examples of distributed arrangements of laminated capacitors 30 with respect to the distribution of power supply terminals 11 for the first APU of IC 10, and distributed arrangements of laminated capacitors 40 with respect to the distribution of power supply terminals 12 for the second APU will be described. FIG. 8 is a diagram showing an example of the distribution of power supply terminals 11 and 12 of two types of power supplies in IC 10. FIG. 9 is a diagram showing an example of a distributed arrangement of laminated capacitors 30 with respect to the distribution of power supply terminals 11 for the first APU in FIG. 8. FIG. 10 is a diagram showing an example of a distributed arrangement of laminated capacitors 40 with respect to the distribution of power supply terminals 12 for the second APU in FIG. 8.

FIG. 8 shows an example of the arrangement of power supply terminals 11 for the first APU and power supply terminals for the second APU of IC 10. In FIG. 8, an open circle represents power supply terminal 11 for the first APU, while a solid circle represents power supply terminal 12 for the second APU. In FIG. 8, a rectangular or substantial rectangle indicated by a sign MA1 represents a distribution area of all power supply terminals 11 for the first APU, and a rectangle or substantial rectangle indicated by a sign MA2 represents a distribution area of all power supply terminals 12 for the second APU.

In this example shown in FIG. 8, power supply terminals 11 for the first APU are arranged and distributed throughout IC 10. In this example, there are 50 power supply terminals 11 for the first APU. Distribution area MA1 of power supply terminals 11 for the first APU is substantially a square measuring about 9 mm, for example, on each side. This distribution area MA1 substantially corresponds to power supply pattern 20$d$ for the first APU. Power supply terminals 12 for the second APU are arranged locally in a portion of IC 10. In this example, there are 24 power supply terminals 12 for the second APU. Distribution area MA2 of power supply terminals 12 for the second APU is substantially a square measuring about 5 mm, for example, on each side. This distribution area MA2 substantially corresponds to power supply pattern 20$f$ for the second APU.

FIG. 9 shows an example of a distributed arrangement of laminated capacitors 30 with respect to the distribution of power supply terminals 11 for the first APU shown in FIG. 8. In FIG. 9, a circle indicated by a sign CA1 represents a cover area of laminated capacitor 30. It is noted that power supply terminals 11 of IC 10 mounted on upper surface 20$a$ of wiring board 20 and laminated capacitors 30 mounted on lower surface 20$b$ of wiring board 20 are shown on the same plane in FIG. 9 for visual clarity of a relationship between the arrangement of power supply terminals 11 and cover areas CA1 of laminated capacitors 30.

In this example, laminated capacitor 30 has a capacity of about 22 μF. There are three laminated capacitors 30 so as to exceed the capacity of decoupling capacitors required of the power supply for the first APU. The capacity of decoupling capacitors required of the power supply for the first APU is about 60 μF, for example. Laminated capacitor 30 has an ESL of about 29.9 pH.

An example of deriving cover area CA1 of this laminated capacitor 30 is described. It is assumed that target frequency $f_T$ is about 25 MHz which corresponds to boundary frequency BF. Target impedance $Z_T$ at target frequency $f_T$ is about 30 mΩ. Impedance $Z_C$ of the capacitor at target frequency $f_T$ is about 4.7 mΩ. Distance h to the solid ground layer is about 0.155 mm. This distance of about 0.155 mm is obtained by adding together three insulating layers 20$k$, 20$l$, 20$m$ each of which measures about 0.035 mm, and two wiring layers each of which measures about 0.025 mm. Width w of the wiring pattern is about 4.5 mm. This width of about 4.5 mm was obtained as half the length of about 9 mm on each side of power supply pattern 20$d$ for the first APU, to prevent slipping of the via. Magnetic permeability $\mu_0$ is about $1.256637 \times 10^{-6}$. Using these values, maximum allowable wiring length $l_{max}$ of laminated capacitor 30, namely, the radius of cover area CA1, is about 3.0 mm from Equation 2.

Three laminated capacitors 30 each having this cover area CA1 having a radius of about 3.0 mm were arranged and distributed as shown in FIG. 9. In this example, 34 power supply terminals 11 out of 50 power supply terminals 11 are included in a region obtained by combining cover areas CA1 of three laminated capacitors 30. A rate of covering power supply terminals 11 by three laminated capacitors 30 is 34/50=68%.

With such a distributed arrangement of three laminated capacitors 30, the ESL was reduced, and the power supply impedance at boundary frequency BF of about 25 MHz was smaller than or equal to first target impedance TI1 of about 30 mΩ. Further, with the parallel connection of three laminated capacitors 30 having high ESR, for example, an ESR of about 20 mΩ, the power supply impedance at antiresonance frequency AF was smaller than or equal to second target impedance TI2.

FIG. 10 shows an example of a distributed arrangement of laminated capacitors 40 with respect to the distribution of power supply terminals 12 for the second APU shown in FIG. 8. In FIG. 10, a circle indicated by a sign CA2 represents a cover area of laminated capacitor 40. It is noted that power supply terminals 12 of IC 10 mounted on upper surface 20$a$ of wiring board 20 and laminated capacitors 40 mounted on lower surface 20$b$ of wiring board 20 are shown on the same plane in FIG. 10 for visual clarity of a relationship between the arrangement of power supply terminals 12 and cover areas CA2 of laminated capacitors 40.

In this example, laminated capacitor 40 has a capacity of about 22 μF. There are five laminated capacitors 40 so as to exceed the capacity of decoupling capacitors required of the power supply for the second APU. The capacity of decoupling capacitors required of the power supply for the second APU is about 100 μF, for example. Laminated capacitor 40 has an ESL of about 29.9 pH.

An example of deriving cover area CA2 of this laminated capacitor 40 is described. It is assumed that target frequency $f_T$ is about 25 MHz. Target impedance $Z_T$ at target frequency $f_T$ is about 25 mΩ. Impedance $Z_C$ of the capacitor at target frequency $f_T$ is about 4.7 mΩ. Distance h to the solid ground layer is about 0.155 mm. Width w of the wiring pattern is about 2.5 mm. This width of about 2.5 mm was obtained as half the length of about 5 mm on each side of power supply pattern 20$f$ for the second APU, to prevent slipping of the via. Magnetic permeability $\mu_0$ is about $1.256637 \times 10^{-6}$. Using these values, maximum allowable wiring length $l_{max}$ of laminated capacitor 40, namely, the radius of cover area CA2, is about 1.7 mm from Equation 2.

Five laminated capacitors 40 each having this cover area CA2 with a radius of about 1.7 mm were arranged and distributed as shown in FIG. 10. In this example, all of 24 power supply terminals 12 are included in a region obtained by combining cover areas CA2 of five laminated capacitors

40. A rate of covering power supply terminals 12 by five laminated capacitors 40 is 24/24=100%.

With such a distributed arrangement of five laminated capacitors 40, the ESL was reduced, and the power supply impedance at boundary frequency BF of about 25 MHz was smaller than or equal to first target impedance TI1 of about 25 mΩ. Further, with the parallel connection of five laminated capacitors 40 having high ESR, for example, an ESR of about 20 mΩ, the power supply impedance at antiresonance frequency AF was smaller than or equal to second target impedance TI2.

Figure 11:
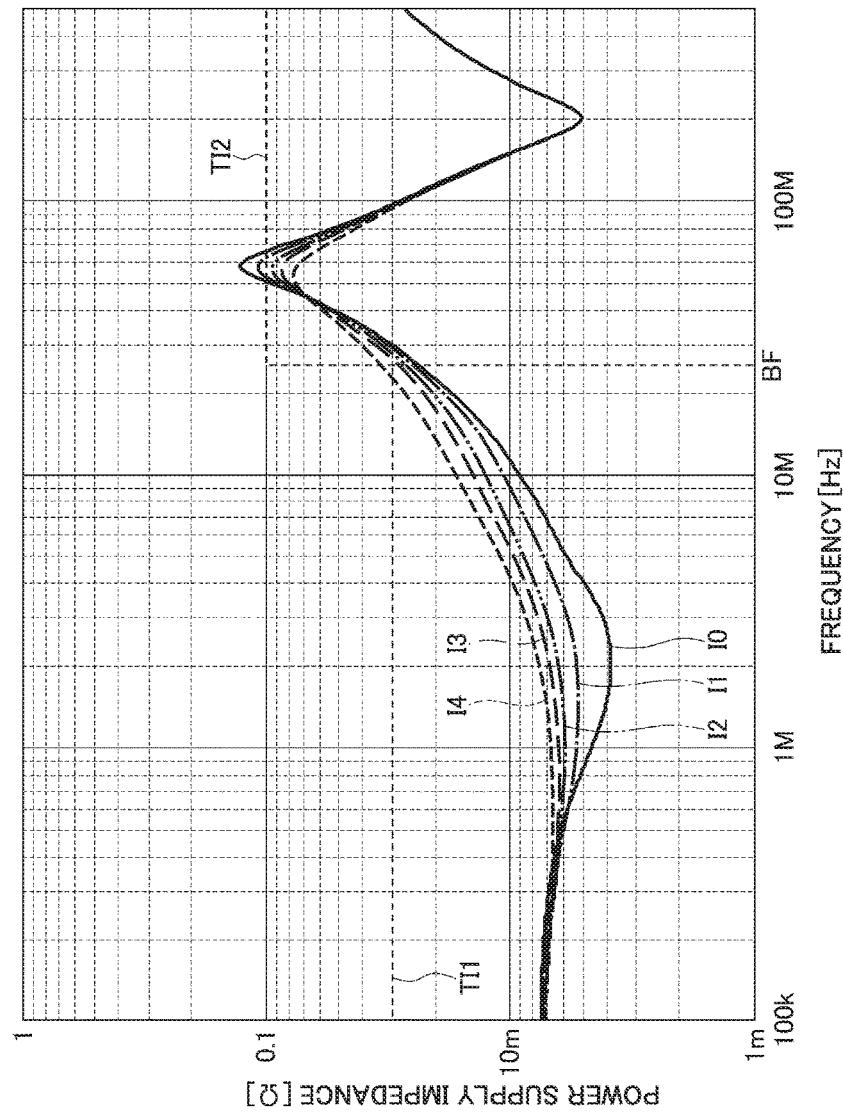
FIG. 11 is a diagram showing comparative examples of a frequency characteristic of a power supply impedance with varying ESR of the laminated capacitors.

Lastly, with reference to FIG. 11, comparative examples of the power supply impedance with varying ESR of three laminated capacitors 30 for the first APU will be described. FIG. 11 is a diagram showing comparative examples of a frequency characteristic of power supply impedance with varying ESR of laminated capacitors 30. Three laminated capacitors 30 all have the same value of ESR. Three laminated capacitors 30 are arranged and distributed as shown in FIG. 9, for example.

In FIG. 11, the horizontal axis represents frequency, and the vertical axis represents power supply impedance. In FIG. 11, a graph indicated by a solid line 10 represents a frequency characteristic of power supply impedance for low ESR, a graph indicated by a chain-dotted line I1 represents a frequency characteristic of power supply impedance when the ESR is about 10 mΩ, a graph indicated by a chain-double-dotted line 12 represents a frequency characteristic of power supply impedance when the ESR is about 20 mΩ, a graph indicated by a broken line 13 with a greater step size represents a frequency characteristic of power supply impedance when the ESR is of about 30 mΩ, and a graph indicated by a broken line I4 with a smaller step size represents a frequency characteristic of power supply impedance when the ESR is about 50 mΩ. It is noted that each of the laminated capacitors having an ESR of about 10 mΩ, about 20 mΩ, about 30 mΩ and about 50 mΩ has a Q factor of less than about 0.5.

When laminated capacitor 30 having a low ESR is used, the anti-resonance is not reduced or prevented. Thus, as indicated by frequency characteristic 10 of power supply impedance, the power supply impedance at the anti-resonance frequency exceeds second target impedance TI2 of about 0.1Ω.

A comparison among frequency characteristics I1 to I4 of power supply impedance when laminated capacitors 30 having a high ESR are used shows that the higher the ESR, the higher the level of the power supply impedance on the lower frequency side than the anti-resonance frequency. Consequently, the anti-resonance is reduced or prevented, and the power supply impedance at the anti-resonance frequency is reduced.

In this example, when laminated capacitor 30 having an ESR of about 20 mΩ, laminated capacitor 30 having an ESR of about 30 mΩ or laminated capacitor 30 having an ESR of about 50 mΩ is used, the power supply impedance at the anti-resonance frequency falls below second target impedance TI2. When laminated capacitor 30 having an ESR of about 50 mΩ is used, however, the power supply impedance at boundary frequency BF exceeds first target impedance TI1 of about 30 mΩ.

Accordingly, when laminated capacitor 30 having an ESR of about 20 mΩ or laminated capacitor 30 having an ESR of about 30 mΩ is used, the power supply impedance at the anti-resonance frequency falls below second target impedance TI2, and the power supply impedance at boundary frequency BF falls below first target impedance TI1. In this example, the power supply impedance is able to be maintained within the target impedance by using laminated capacitor 30 having a high ESR of about 20 mΩ, or more and about 30 mΩ or less.

In accordance with mounted structure 1 of the laminated capacitors according to preferred embodiments of the present invention, for each type of power supply, the power supply impedance is able to be maintained within the target impedance. In accordance with mounted structure 1 of the laminated capacitors according to preferred embodiments of the present invention, for each type of power supply, the parallel connection and distributed arrangement of laminated capacitors 30 and 40 enables an appropriate increase in ESR and decrease in ESL by a small number of preferably, for example, five or less, laminated capacitors 30 and 40, thereby keeping the mounting area of laminated capacitors 30 and 40 small. It is noted that in mounted structure 1 of the laminated capacitors according to preferred embodiments of the present invention, the number of laminated capacitors 30 and 40 is able to be reduced by using high-capacity laminated capacitors 30 and 40.

In accordance with mounted structure 1 of the laminated capacitors according to a preferred embodiment, two or more laminated capacitors 30 and 40 including a laminated capacitor having a high ESR are provided in parallel, thereby enabling accurate adjustment of the ESR by two or more laminated capacitors 30 and 40, to increase the ESR appropriately. With this increased ESR, the anti-resonance that occurs between the capacity of IC 10 and the inductance of laminated capacitors 30 and 40 are able to be reduced or prevented. Consequently, the power supply impedance is able to be maintained within second target impedance 112 in the frequency band greater than boundary frequency BF, particularly at the anti-resonance frequency.

In accordance with mounted structure 1 of the laminated capacitors according to a preferred embodiment, laminated capacitors 30 and 40 which are three-terminal capacitors having a low ESL are used, and these two or more laminated capacitors 30 and 40 having a low ESL are connected in parallel, and arranged and distributed with respect to the distribution of power supply terminals 11 and 12, thereby reducing the ESL using a small number of laminated capacitors 30 and 40. Consequently, the power supply impedance that increases on the lower frequency side than the anti-resonance frequency is able to be adjusted by the increased ESR, to reduce the power supply impedance. Consequently, the power supply impedance is able to be maintained within first target impedance Il1 at boundary frequency BF.

In accordance with mounted structure 1 of the laminated capacitors according to a preferred embodiment, since the number of laminated capacitors 30 and 40 is preferably set to five or less for each type of power supply, the mounting area of laminated capacitors 30 and 40 is reduced.

In accordance with mounted structure 1 of the laminated capacitors according to a preferred embodiment, since laminated capacitors 30 and 40 are arranged and distributed such that all power supply terminals 11 and 12 are included in the region obtained by combining the cover areas of two or more laminated capacitors 30 and 40, the ESL is able to be efficiently reduced to lower the power supply impedance.

Although preferred embodiments of the present invention have been described above, the present invention is not limited to the above-described preferred embodiments but is susceptible to various variations. For example, although the above-described preferred embodiments have described an example of two types of power supplies for the first APU and for the second APU as the types of power supplies of IC 10 which is an integrated circuit, the present invention is applicable to cases where there is one type, or there are three or more types, of power supplies of the integrated circuit.

Although the resistance (ESR) is increased by the addition of a resistive layer on the inside of each of external electrodes 32 and 33 in the above preferred embodiment, the resistance of each of external electrodes 32 and 33 themselves may be increased by the use of a resin electrode, instead of the metal electrode, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounted structure of a laminated capacitor comprising:
    a wiring board including a power supply pattern and a ground pattern;
    an integrated circuit mounted on the wiring board; and
    a plurality of laminated capacitors mounted on the wiring board; wherein
    the wiring board is provided with the power supply pattern for each type of power supply supplied to the integrated circuit;
    the integrated circuit includes a plurality of power supply terminals for each type of power supply, the plurality of power supply terminals being electrically connected to the power supply pattern of a corresponding one of the power supplies;
    each of the plurality of laminated capacitors includes:
        a laminated body with a rectangular or substantially rectangular parallelepiped shape in which a first internal electrode and a second internal electrode are alternately laminated with a dielectric layer interposed therebetween;
        a first external electrode and a second external electrode provided on opposite end surfaces of the laminated body, respectively, and electrically connected to opposite ends of the first internal electrode, respectively; and
        a pair of third external electrodes provided on opposite side surfaces of the laminated body, respectively, and electrically connected to opposite ends of the second internal electrode, respectively;
    the first external electrode and the second external electrode is electrically connected to the power supply pattern;
    the pair of third external electrodes is electrically connected to the ground pattern;
    for each type of power supply, two or more of the plurality of laminated capacitors are provided in parallel between the power supply of the integrated circuit and a ground;
    the two or more of the plurality of laminated capacitors provided for each type of power supply including a laminated capacitor have a Q factor, which indicates a quality factor of a capacitor, of less than about 0.5;
    for each type of power supply, in order to satisfy a target impedance including a first target impedance in a frequency band smaller than or equal to a boundary frequency, and a second target impedance greater than the first target impedance and in a frequency band greater than the boundary frequency, the two or more of the plurality of laminated capacitors are arranged and distributed such that at least half of the plurality of power supply terminals are included in a region obtained by combining cover areas, each of the cover areas being defined to correspond to a maximum allowable wiring length of each of the laminated capacitors; and
    the maximum allowable wiring length satisfies the equation:

$$l_{max} = \frac{Z_T - Z_C}{2 f_T \mu_0 \left(\frac{h}{w}\right)^{0.6}}$$

wherein $l_{max}$ represents the maximum allowable wiring length,
    $f_T$ represents a target frequency,
    $Z_T$ represents the target impedance at the target frequency $f_T$,
    $Z_C$ represents an impedance of the capacitor at the target frequency $f_T$,
    h represents a distance from a mounting surface of a layer of the wiring board on which the capacitor is mounted to the ground pattern,
    w represents a width of the power supply pattern, and
    $\mu_0$ represents magnetic permeability.

2. The mounted structure of a laminated capacitor according to claim 1, wherein, for each type of power supply, two or more and five or less of the plurality of laminated capacitors are provided in parallel between the power supply of the integrated circuit and the ground.

3. The mounted structure of a laminated capacitor according to claim 1, wherein, in at least one type of power supply, the two or more of the plurality of laminated capacitors are arranged and distributed such that all of the plurality of power supply terminals are included in the region obtained by combining the cover areas.

4. The mounted structure of a laminated capacitor according to claim 1, wherein, the ground pattern is a ground plane.

5. The mounted structure of a laminated capacitor according to claim 1, wherein each of the plurality of laminated capacitors has outer dimensions including a dimension of about 1.2 mm in the length direction, a dimension of about 0.9 mm in the width direction, and a dimension of about 0.75 mm in the thickness direction.

6. The mounted structure of a laminated capacitor according to claim 1, wherein each of the first and second external electrodes is also provided on a portion of opposite main surfaces of the laminated body and on a portion of the opposite side surfaces of the laminated body.

7. The mounted structure of a laminated capacitor according to claim 1, wherein each of the pair of third external electrodes is also provided on a portion of opposite main surfaces of the laminated body.

8. The mounted structure of a laminated capacitor according to claim 1, wherein
    the first internal electrode includes a body portion, a first drawn-out portion and a second drawn-out portion;
    the first drawn-out portion is provided on a first end of body portion, and is electrically connected to first external electrode; and
    the second drawn-out portion is provided on a second end of body portion opposite to the first end, and is electrically connected to second external electrode.

9. The mounted structure of a laminated capacitor according to claim 1, wherein the second internal electrode includes a body portion and a pair of drawn-out portions;

the pair drawn-out portions are provided on first and second opposite ends of body portion, and are electrically connected to the pair third external electrodes.

10. The mounted structure of a laminated capacitor according to claim 1, wherein
the first to third external electrodes each preferably include a Cu electrode, and at least one plated layer covering the Cu electrode.

11. The mounted structure of a laminated capacitor according to claim 10, wherein the at least one plated layer includes a nickel-plated layer and a tin plated layer covering this nickel plated layer.

12. The mounted structure of a laminated capacitor according to claim 11, wherein at least one of the plurality of laminated capacitors includes a resistive layer inside of first external electrode and the second external electrode.

13. The mounted structure of a laminated capacitor according to claim 11, wherein each of the plurality of laminated capacitors includes a resistive layer inside of first external electrode and the second external electrode.

14. A method of mounting a laminated capacitor comprising:
providing an integrated circuit and a plurality of laminated capacitor mounted on a wiring board that includes a power supply pattern and a ground pattern, the wiring board being provided with the power supply pattern for each type of power supply supplied to the integrated circuit, the integrated circuit including a plurality of power supply terminals for the each type of power supply, the plurality of power supply terminals being electrically connected to the power supply pattern of a corresponding one of the power supplies, each of the laminated capacitors including a laminated body with a rectangular or substantially rectangular parallelepiped shape in which a first internal electrode and a second internal electrode are alternately laminated with a dielectric layer interposed therebetween, a first external electrode and a second external electrode provided on opposite end surfaces of the laminated body, respectively, and electrically connected to opposite ends of the first internal electrodes, respectively, and a pair of third external electrodes provided on opposite side surfaces of the laminated body, respectively, and electrically connected to opposite ends of the second internal electrode, respectively;
electrically connecting the first external electrode and the second external electrode to the power supply pattern, and electrically connecting the pair of third external electrodes to the ground pattern;
for the each type of power supply, providing two or more of the plurality of laminated capacitors in parallel between the power supply of the integrated circuit and a ground, the two or more of the plurality of laminated capacitors provided for the each type of power supply including a laminated capacitor having a Q factor, which indicates a quality factor of a capacitor, of less than about 0.5;
for the each type of power supply, in order to satisfy a target impedance including a first target impedance in a frequency band smaller than or equal to a boundary frequency, and a second target impedance greater than the first target impedance and in a frequency band greater than the boundary frequency, arranging and distributing the two or more of the plurality of laminated capacitors such that at least half of the plurality of power supply terminals are included in a region obtained by combining cover areas, each of the cover areas being defined to correspond to a maximum allowable wiring length of each of the laminated capacitors; and
the maximum allowable wiring length satisfies the equation:

$$l_{max} = \frac{Z_T - Z_C}{2 f_T \mu_0 \left(\frac{h}{w}\right)^{0.6}}$$

wherein $l_{max}$ represents the maximum allowable wiring length,
$f_T$ represents a target frequency,
$Z_T$ represents the target impedance at the target frequency $f_T$,
$Z_C$ represents an impedance of the capacitor at the target frequency $f_T$,
h represents a distance from a mounting surface of a layer of the wiring board on which the capacitor is mounted to the ground pattern,
w represents a width of the power supply pattern, and
$\mu_0$ represents magnetic permeability.

15. The method of mounting a laminated capacitor according to claim 14, wherein, for each type of power supply, two or more and five or less of the plurality of laminated capacitors are provided in parallel between the power supply of the integrated circuit and the ground.

16. The method of mounting a laminated capacitor according to claim 1, wherein, in at least one type of power supply, the two or more of the plurality of laminated capacitors are arranged and distributed such that all of the plurality of power supply terminals are included in the region obtained by combining the cover areas.

* * * * *